United States Patent [19]

Suzuki

[11] 4,208,641
[45] Jun. 17, 1980

[54] HYBRID INTEGRATED IMPEDANCE CONVERTER CIRCUIT

[75] Inventor: Toshiro Suzuki, Hachioji, Japan

[73] Assignees: Hitachi, Ltd.; Hitachi Denshi Kabushiki Kaisha, both of Japan

[21] Appl. No.: 892,420

[22] Filed: Mar. 31, 1978

[30] Foreign Application Priority Data

Apr. 8, 1977 [JP] Japan .................................. 52-39521

[51] Int. Cl.² ............................................. H03H 5/04
[52] U.S. Cl. .................................... 333/217; 330/107; 333/213
[58] Field of Search ........................... 333/80 R, 80 T; 330/107, 271, 307; 307/230; 328/128

[56] References Cited

U.S. PATENT DOCUMENTS

| 4,091,329 | 5/1978 | Fletcher et al. | 307/230 X |
| 4,091,341 | 5/1978 | Greaves et al. | 333/80 R X |

Primary Examiner—Paul L. Gensler
Attorney, Agent, or Firm—Craig & Antonelli

[57] ABSTRACT

A hybrid integrated impedance converter circuit comprising a frequency dependent negative resistance circuit, in which two operational amplifiers are included. Each of the two operational amplifiers has an output terminal and an inverting input terminal, with a negative feedback capacitor being connected between these terminals. The negative feedback capacitor is formed by a stray capacitance which arises between conductors connected to the output and inverting input terminals, which conductors are placed in close proximity to each other.

14 Claims, 7 Drawing Figures

HYBRID INTEGRATED IMPEDANCE CONVERTER CIRCUIT

LIST OF PRIOR ART (37 CFR 1.56(a))

The following references are cited to show the state of the art:

(1) A. Antoniou, "Realisation of gyrators using operational amplifiers, and their use in RC-active-network synthesis," PROC. IEE, Vol. 116, No. 11, P. 1838, Nov. 1969

(2) L. T. Bruton et al., "Network Transfer Functions Using the Concept of Frequency-Dependent Negative Resistance," IEEE Trans., Vol. CT-16, No. 8, P. 406, Aug. 1969

BACKGROUND OF THE INVENTION

1. Field of the Invention

This invention relates to an impedance converter circuit for use in a filter, etc. More particularly, it relates to the stabilization of an impedance converter circuit employing an RC-active circuit.

2. Description of the Prior Art

The development of filters in recent years has centered on an RC-active filter which can exploit the thin-film circuit technology and the thick-film circuit technology, and the miniaturization of filters and the reduction of cost have been aimed at with the RC-active filter. However, when the thin-film and thick-film circuit technologies are utilized, the precisions of elements cannot be made high, and hence, it is a prerequisite to lower the desired precisions of circuit elements.

From the viewpoint of the low element precision, an active filter circuit employing an FDNR circuit (frequency-dependent negative resistance circuit) (FDNR type filter circuit) is advantageous. The FDNR circuit is a two-terminal circuit with one terminal grounded which realizes an impedance proportional to $S^{-2}$ (where S denotes the Laplace-transformed angular frequency $j\omega$) by the use of an RC-active circuit. The FDNR type filter realizes a filter equivalent to a conventional LC type filter by replacing C in the LC type filter with the FDNR circuit, L with R, and R with C.

There are various methods for materializing the FDNR circuit. One of the most typical methods is the expedient employing a GIC (general impedance converter) as published by A. Antoniou. Antonious's GIC is described in detail in literature (1) mentioned in the List of Prior Art, and the circuit arrangement thereof will be stated in detail later. The application of Antoniou's GIC to the FDNR circuit is described in detail in literature (2) mentioned in the List of Prior Art.

In a case where Antoniou's GIC used in the FDNR circuit is intended to be put into the form of a hybrid IC, interconnections and resistive elements, and further, capacitive elements are formed on an insulating substrate by the thin-film and thick-film circuit technologies, and active elements such as operational amplifiers (the expression "operational amplifier" refers to an amplifier which has differential input terminals, whose gain is sufficiently large, whose input impedance is sufficiently high and whose output impedance is sufficiently low) are arranged at predetermined positions on the insulating substrate and are connected with the various elements. The capacitive elements are sometimes formed on a stacked chip. In this case of the hybrid IC, stray capacitances appear between the interconnections formed on the insulating substrate in order to connect the various elements or between the interconnections and the earth. By way of example, this becomes equivalent to the incorporation of capacitors between the inverting inputs and non-inverting inputs of the operational amplifiers or between the inverting inputs and the earth. As a result, the hybird IC is prone to give rise to unstable operations such as the oscillation of the circuit and the fluctuation of a frequency response.

SUMMARY OF THE INVENTION

An object of this invention is to provide a hybird integrated impedance converter circuit which effects a stable operation even when stray capacitances have developed in the hybrid IC.

In order to accomplish the object, this invention disposes, in Antoniou's GIC put into the form of a hybrid IC, a negative feedback capacitor between an output terminal of at least one of operational amplifiers and an inverting input terminal thereof. Further, according to this invention, as the negative feedback capacitor stray capacitance is deliberately formed between an interconnection connected with the output terminal of at least one of the operational amplifiers and an interconnection connected with the inverting input terminal thereof.

BRIEF DESCRIPTION OF THE DRAWINGS

FIGS. 6(a) and 6(b) are enlarged schematic views of the crossover part in FIG. 5, in which FIG. 6(a) shows a top plan of the crossover part and FIG. 6(b) shows a section taken along A—A' in FIG. 6(a).

DESCRIPTION OF THE PREFERRED EMBODIMENTS

Before explaining embodiments of this invention, Antoniou's GIC and an FNDR circuit will be briefly described with reference to the drawings.

Figure 1:
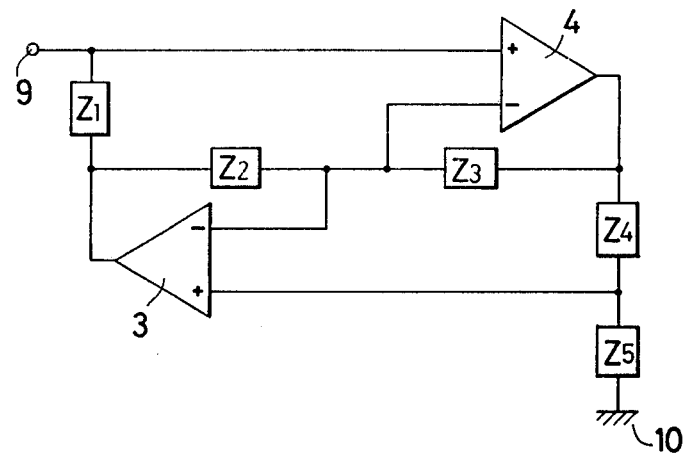
FIG. 1 is a circuit diagram showing the fundamental circuit arrangement of Antoniou's GIC.

FIG. 1 is a circuit diagram showing the fundamental circuit of Antoniou's GIC. The impedance $Z_{in}$ between a terminal 9 and the earth 10 is represented by:

$$Z_{in}=(Z_1 \cdot Z_3 \cdot Z_5)/Z_2 \cdot Z_4$$

where $Z_1$ to $Z_5$ denote the impedances of impedance elements which are capacitive elements or resistive elements. Numerals 3 and 4 in the figure designate operational amplifiers, respectively. This circuit can linearly vary the input impedance merely by changing any one of the impedances $Z_1$–$Z_5$. Besides, the sensitivities are equal for all the elements, and hence, the handling is very easy. The circuit is therefore utilized for a gyrator, an FDNR, etc.

In materializing with Antoniou's GIC an FDNR circuit which is a two-terminal circuit with one terminal grounded to realize an impedance proportional to $S^{-2}$, several aspects of choice of the impedance elements are considered in such a manner that the components $Z_1$ and $Z_5$ are made the capacitive elements, while the components $Z_2$, $Z_3$ and $Z_4$ are made the resistive elements, or that the components $Z_1$ and $Z_3$ are made the capacitive elements, while the components $Z_2$, $Z_4$ and $Z_5$ are made the resistive elements.

Figure 2:
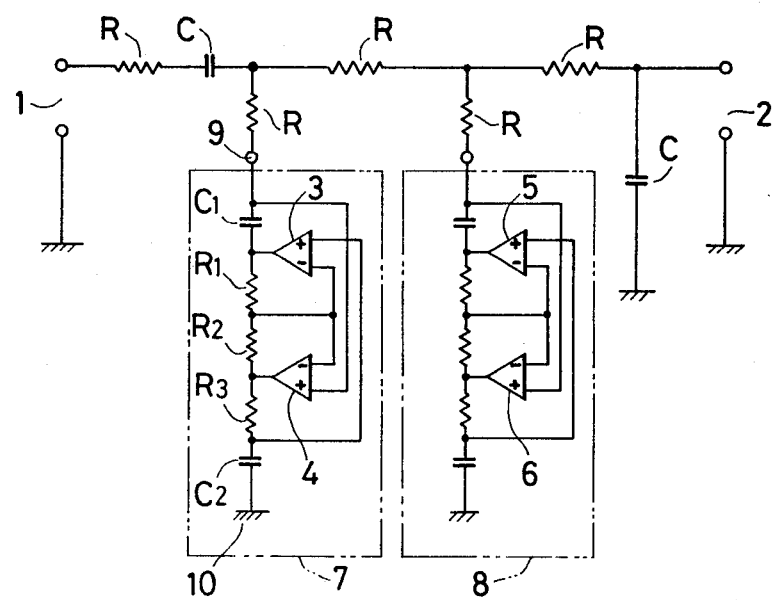
FIG. 2 is a circuit diagram showing the schematic circuit arrangement of an FDNR type filter.

FIG. 2 is a circuit diagram showing an FDNR type filter constructed by the use of FDNR circuits each of which is built by putting $Z_1$ and $Z_5$ in FIG. 1 into the capacitive elements and $Z_2$, $Z_3$ and $Z_4$ into the resistive elements. This filter serves as a low-pass filter, and the operation will not be described in detail because it is not directly pertinent to this invention. Referring to the figure, numeral 1 designates an input terminal of the filter, numeral 2 an output terminal of the filter, and numerals 5 and 6 operational amplifiers similar to those 3 and 4 in FIG. 1. Needless to say, portions 7 and 8 are the FDNR circuits respectively.

As regards the FDNR circuit 7 (the same applies to the FDNR circuit 8), the impedance $Z_{in}$ between the terminal 9 and the earth 10 is given by the following equation:

$$Z_{in} = R_2/(S^2 C_1 C_2 R_1 R_3)$$

where

S: Laplace-transformed angular frequency ($j\omega$), $C_1$, $C_2$, $R_1$, $R_2$, $R_3$: impedances of the respective impedance elements.

Figure 3:
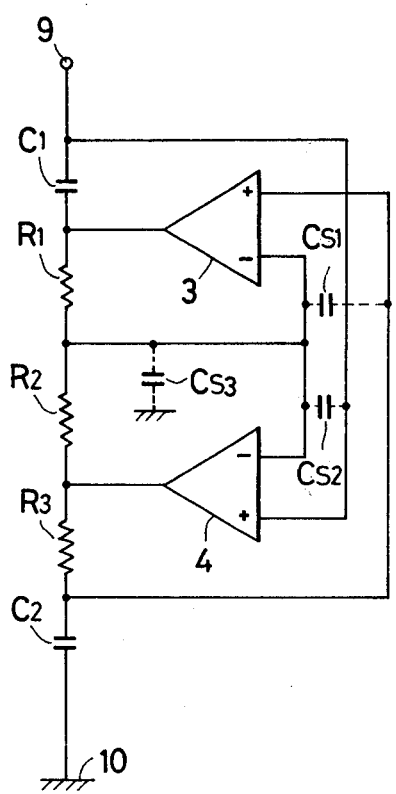
FIG. 3 is a schematic circuit arrangement diagram showing by way of example stray capacitances which appear in case of constructing an FDNR circuit into a hybrid IC.

FIG. 3 shows stray capacitances which develop in case of putting the FDNR circuit 7 into the form of a hybrid IC. That is, FIG. 3 is a circiut diagram of an equivalent circuit in the case where the FDNR circuit 7 is put into the form of a hybrid IC. In this case, a shielding earth conductor is usually formed on the entire area of the rear surface of a hybrid IC substrate. Of course, when no shield is required, the earth conductor may be dispensed with. At this time, the stray capacitances between the earth and interconnections become small.

In FIG. 3, $C_{s1}$ and $C_{s2}$ designate the stray capacitances which appear between an interconnection connected to inverting input terminals of the operational amplifiers 3 and 4 and interconnections connected to non-inverting input terminals thereof. $C_{s3}$ indicates the stray capacitance which appears between the interconnection connected to the inverting input terminals of the operational amplifiers 3 and 4 and the earth. These stray capacitances are, for example, about 2 pF, and give rise to the oscillation phenomenon whose frequency is about 500 KHz–1 MHz.

The relationship between the stray capacitances and the oscillation is qualitatively elucidated as below. The stray capacitances $C_{s1}$ and $C_{s2}$ have the effect of increasing the inphase input components of the respective operational amplifiers 3 and 4 at high frequencies. Negative feedback components decrease to the amount of the increased inphase input components, and an oscillatory condition is established. On the other hand, the stray capacitance $C_{s3}$ reduces the negative feedback components of the operational amplifiers 3 and 4 at high frequencies and establishes an oscillatory condition. The inventors have experimentally revealed that, if the stray capacitances can be suppressed to below approximately 0.5 pF, the oscillating phenomenon can be prevented. In the case of the hybrid IC, however, it is difficult to lower the stray capacitances to below approximately 0.5 pF. In order to suppress the oscillation phenomenon, the impedance level of the circuit may be sufficiently lowered so that the inphase input components of the operational amplifiers 3 and 4 may become less than one at the frequency at which the oscillation occurs. Such a condition, however, renders the capacitances $C_1$ and $C_2$ in the circuit unduly high and makes it impossible to form the hybrid IC.

Hereunder, the embodiments of this invention will be described in detail with reference to the drawings.

Figure 4:
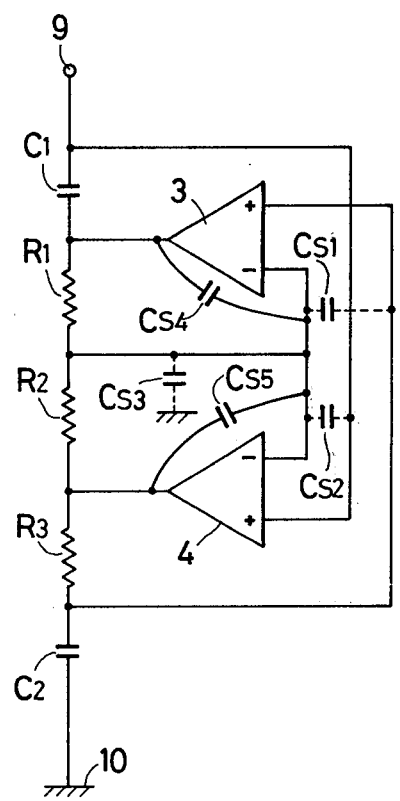
FIG. 4 is a schematic circuit arrangement diagram of an embodiment in the case where this invention is applied to the FDNR circuit.

FIG. 4 is a schematic circuit diagram of an embodiment in the case where this invention is applied to the FDNR circuit. For the respective operational amplifiers 3 and 4 in the figure, negative feedback capacitors $C_{s4}$ and $C_{s5}$ are inserted between the output terminals and the inverting input terminals. The negative feedback capacitors $C_{s4}$ and $C_{s5}$ increase the quantities of negative feedback in order to suppress the gains of the operational amplifiers 3 and 4 in the frequency region of the oscillations ascribable to the capacitances $C_{s1}$ to $C_{s3}$. The quantities of negative feedback by the negative feedback capacitors $C_{s4}$ and $C_{s5}$ suffice if they can neutralize the positive feedback components. Therefore, the capacitances of these capacitors are made a value approximately equal to the maximum one of the capacitances $C_{s1}$—$C_{s3}$ (approximately 0.5 pF—several pF) or a greater value. In an example, even when the value of the negative feedback stray capacitances $C_{s4}$ and $C_{s5}$ was made about 10 pF, the characteristics of the FDNR circuit were not affected at all. As the reason therefor, it is thought that the negative feedback capacitors $C_{s4}$ and $C_{s5}$ will be inserted in parallel with $R_1$ and $R_2$ in the denominator and numerator of the foregoing equation of $Z_{in}$, respectively, so they will have no influence on $Z_{in}$. The capacitance value can be simply found by calculation or experiment, and the design and fabrication of the capacitors to be inserted may rely on the technology of ordinary hybrid IC's.

In this regard, in order to retrench the step of manufacturing the capacitances to be inserted and the space thereof in case of forming the hybrid IC, stray capacitances on an interconnection pattern can be deliberately utilized without separately employing discrete components. That is, since the capacitances $C_{s1}$–$C_{s3}$ are stray capacitances which arise due to parallel interconnections, crossovers etc., the interconnection pattern to incorporate the capacitances $C_{s4}$ and $C_{s5}$ may be provided with parallel interconnections, crossovers etc. and designed so that the same extent of capacitances may be physically parasitic.

Figure 5:
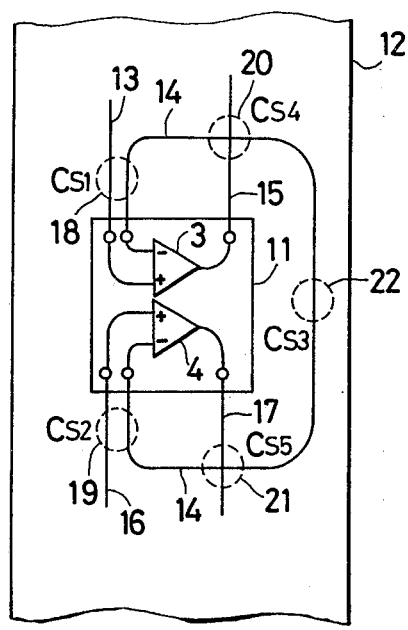
FIG. 5 is a schematic constructional diagram of the essential portions of a hybrid IC in which negative feedback stray capacitances in the embodiment of FIG. 4 are formed of crossover parts of interconnections.

FIG. 5 shows an embodiment of this invention in which, on the basis of this idea, the negative feedback capacitors $C_{s4}$ and $C_{s5}$ are constructed of stray capacitances in a hybrid IC pattern. In the figure, the resistive elements and the capacitive elements are not shown. Referring to the figure, numeral 11 designates an IC chip formed with the operational amplifiers 3 and 4, numeral 12 a substrate of the hybrid IC, numerals 13 to 17 interconnections on the substrate 12, and numerals 18 and 19 parallel interconnection portions. The stray capacitances $C_{s1}$ and $C_{s2}$ appear due to the parallel interconnection portions 18 and 19. The stray capacitance $C_{s3}$ appears between the earth conductor formed on the rear surface of the substrate 12 and the interconnection 14, and is indicated at 22 in the figure.

Figure 6A:
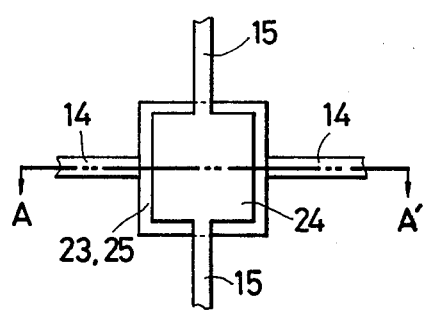
Figure 6B:
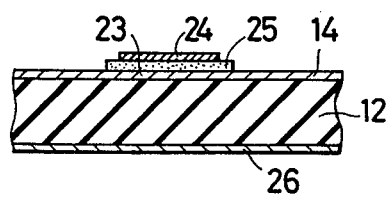

In the illustration, the negative feedback capacitors $C_{s4}$ and $C_{s5}$ are respectively formed by crossover portions 20 and 21 between the interconnection 14 and the interconnections 15 and 17. The value of the negative feedback capacitances $C_{s4}$ and $C_{s5}$ may be properly set by selecting the sort of an insulator between both the interconnections, the thickness thereof, and the width (i.e., area) of the crossover portion. As an example, FIGS. 6(a) and 6(b) show an embodiment in which the value of the negative feedback capacitances $C_{s4}$ and $C_{s5}$ is set by expanding the width of the crossover portion. FIG. 6(a) is a plan view of the crossover portion, while FIG. 6(b) is a sectional view taken along A—A' in FIG. 6(a). Referring to the figures, numeral 23 indicates a crossover part which is formed by the same step as that of the interconnection 14 and which is such that a fraction of the interconnection 14 has the width enlarged. Numeral 24 indicates a crossover part which is formed by the same step as that of the interconnection 15 and which is such that a fraction of the interconnection 15 has the width expanded. Numeral 25 denotes an insulator interposed between the crossover parts 23 and 24, and numeral 26 denotes an earth conductor.

Here, the area of the crossover part 23 is made $1.5 \times 1.5$ mm², and that of the crossover part 24 is made $1.1 \times 1.1$ mm². The insulator 25 is made of $TiO_2$ which s about 20 μm thick. Then, the stray capacitance of this crossover portion becomes approximately 6 pF. Of course, it is sometimes unnecessary to enlarge the width of the crossover portion of the interconnection pattern. As the substrate 12, a ceramic base plate is employed, and as the interconnection conductor as well as the earth conductor, an Ag-Pd alloy or a material containing Au is printed and baked. The interconnections can be formed at about 250–500 μm in both the width and the spacing.

In the embodiment of FIG. 5, the influence of the stray capacitances $C_{s1}$ and $C_{s2}$ having appeared in the proximate parts of the interconnections of the hybrid IC is nullified by the negative feedback capacitances $C_{s4}$ and $C_{s5}$ created by forming the crossover portions of the interconnections. A design can also be made so that the influence of stray capacitances to appear in the crossover portions of interconnections in case of forming a hybrid IC may be nullified by negative feedback capacitances created by forming proximate parts of the interconnections. At this time, the value of the negative feedback capacitances can be set by changing the spacing between two parallel interconnections or making different the lengths or thicknesses of the parallel interconnections. Of course, the influence of stray capacitances having appeared in the crossover portions of interconnections may be annulled by negative feedback capacitances created by other crossover portions of the interconnections, and the influence of stray capacitances to appear in parllel or proximate portions of inerconnections may be annulled by negative feedback capacitances created by forming other parallel or proximate portions of the interconnections. Additionally, in this invention a negative feedback capacitance may be disposed between the output terminal and the inverting input terminal of only one of the operational amplifiers.

Although the above embodiments have been set forth by taking as an example of FDNR circuit wherein the impedance elements $Z_1$ and $Z_5$ in the GIC of FIG. 1 are the capacitive elements and those $Z_2$, $Z_3$ and $Z_4$ are the resistive elements, this invention is similarly applicable to other FDNR circuits. In addition, this invention is applicable to a gyrator circuit wherein either the impedance element $Z_2$ or $Z_4$ in the GIC of FIG. 1 is the capacitive element and all the other impedance elements are the resistive elements. That is, this invention can solve the problem of the oscillations attributed to stray capacitances which appear when any GIC having the construction of FIG. 1 is put into the form of a hybrid IC.

We claim:

1. In an impedance converter circuit constructed of a hybrid integrated circuit comprising first, second, third, fourth and fifth impedance elements and first and second operational amplifiers between an input terminal and an earth terminal, said first to fifth impedance elements being connected in series between said input terminal and said earth terminal, an output terminal of said first operational amplifier being connected between said first impedance element and second impedance element, a non-inverting input terminal of said first operational amplifier being connected between said fourth impedance element and said fifth impedance element, an output terminal of said second operational amplifier being connected between said third impedance element and said fourth impedance, a non-inverting input terminal of said second operational amplifier being connected to said input terminal, inverting input terminals of said first and second operational amplifiers being connected between said second impedance element and said third impedance element, said converter circuit being susceptible to instability due to the occurrence of stray capacitances, the improvement which comprises a negative feedback capacitance disposed between the output terminal of at least one of said first and second operational amplifiers and the inverting input terminal thereof, said negative feedback capacitance being deliberately formed by stray capacitance between an interconnection spliced to the output terminal of said at least one of said first and second operational amplifiers and an interconnection spliced to the respective inverting input terminal thereof, said negative feedback capacitance being of a value to substantially stabilize operation of said converter circuit.

2. A hybrid integrated impedance converter circuit according to claim 1, wherein said negative feedback capacitances are formed between the respective output terminals of both of said first and second operational amplifiers and the respective inverting input terminals thereof.

3. A hybrid integrated impedance converter circuit according to claim 1, wherein a value of said negative feedback capacitance is set to be, at least, approximately equal to a maximum value of stray capacitances between interconnections spliced to said non-inverting and inverting input terminals of said operational amplifiers and a stray capacitance between the interconnection spliced to said inverting input terminals and the earth of said hybrid integrated circuit.

4. A hybrid integrated impedance converter circuit according to claim 1, wherein said negative feedback capacitance is formed by stray capacitance owing to a proximate arrangement of the interconnection spliced to the output terminal of said at least one of said first and second operational amplifiers and an interconnection spliced to the inverting input terminal thereof.

5. A hybrid integrated impedance converter circuit according to claim 1, wherein said negative feedback capacitance is formed by stray capacitance owing to a crossover arrangement of the interconnections spliced to the output terminal of said at least one of said first and second operational amplifiers and an interconnection spliced to the inverting input terminal thereof.

6. A hybrid integrated impedance converter circuit according to claim 5, wherein a width of those parts of said interconnections which are held in the crossover arrangement is greater than a width of the remaining parts.

7. A hybrid integrated impedance converter circuit according to claim 1, 2, 3, 4, 5, or 6, wherein said first and fifth impedance elements are capacitive elements, and said second, third and fourth impedance elements are resistive elements.

8. A hybrid integrated impedance converter circuit comprising:
an input terminal and an earth terminal;
impedance means providing a plurality of impedance elements connected in series between said terminals;
a pair of operational amplifiers, each of which has an output terminal, an inverting input terminal and a non-inverting input terminal, said terminals being coupled to said impedance means through conductors, respectively; said converter circuit being susceptible to instability due to the occurrence of stray capacitances, and
a negative feedback capacitor connected between said output and inverting input terminal of at least one of said amplifiers, said negative feedback capacitor being a stray capacitance deliberately formed between conductors connected to said output and inverting input terminals, said negative feedback capacitance being of a value to substantially stabilize operation of said converter circuit.

9. A hybrid integrated impedance converter circuit according to claim 8, wherein said negative feedback capacitor is a stray capacitance owing to a proximate arrangement of conductors connected to said output and inverting input terminals.

10. A hybrid integrated impedance converter circuit according to claim 8, wherein said negative feedback capacitor is a stray capacitance owing to a crossover arrangement of conductors connected to said output and inverting input terminals.

11. A hybrid integrated impedance converter circuit comprising:
an input terminal and an earth terminal;
impedance means providing a plurality of impedance elements connected in series between said terminals; and
a pair of operational amplifiers, each of which has an output terminal, an inverting input terminal and a non-inverting input terminal, said terminals being coupled to said impedance means through conductors, respectively, said converter circuit being susceptible to instability due to the occurrence of stray capacitances,
wherein the respective inverting input terminals are connected together by a conductor coupled between said inverting input terminals, said conductor being arranged in proximate relationship with conductors coupled to the respective output terminals of each of said amplifiers to form a negative feedback capacitor between said output and inverting input terminals of each said amplifier by stray capacitance deliberately formed between said conductors connected to said output terminals and said inverting input terminals, said negative feedback capacitance being of a value to substantially stabilize operation of said converter circuit.

12. In an impedance converter circuit constructed of a hybrid integrated circuit comprising first, second, third, fourth and fifth impedance elements and first and second operational amplifiers between an input terminal and an earth terminal, said first to fifth impedance elements being connected in series between said input terminal and said earth terminal, an output terminal of said first operational amplifier being connected between said first impedance element and second impedance element, a non-inverting input terminal of said first operational amplifier being connected between said fourth impedance element and said fifth impedance element, an output terminal of said second operational amplifier being connected between said third impedance element and said fourth impedance, a non-inverting input terminal of said second operational amplifier being connected to said input terminal, inverting input terminals of said first and second operational amplifiers being connected between said second impedance element and said third impedance element, wherein the respective inverting input terminals are connected together by a conductor coupled between said inverting input terminals, said converter circuit being susceptible to instability due to the occurrence of stray capacitances, said conductor being arranged in proximate relationship with conductors coupled to the respective output terminals of each of said amplifiers to form negative feedback capacitances disposed between the respective output terminals of said first and second operational amplifiers and the respective inverting input terminals thereof by stray capacitances deliberately formed between said conductors coupled to the respective output terminals of said first and second operational amplifiers to the respective inverting input terminals thereof, said negative feedback capacitance being of a value to substantially stabilize operation of said converter circuit.

13. A hybrid integrated impedance converter circuit according to claim 11 or 12, wherein said negative feedback capacitor is a stray capacitance owing to a crossover arrangement of said conductors connected to said output terminals and inverting input terminals.

14. A hybrid integrated impedance converter circuit according to claim 11 or 12, wherein a value of said each negative feedback capacitance is set to be, at least, approximately equal to a maximum value of stray capacitances between interconnections spliced to said non-inverting and inverting input terminals of said operational amplifiers and a stray capacitance between the interconnection spliced to said inverting input terminals and the earth of said hybrid integrated circuit so that said negative feedback capacitance will offset the other stray capacitances to reduce the tendency of the circuit to oscillate.

* * * * *